(12) United States Patent
Kesselring

(10) Patent No.: US 7,477,075 B2
(45) Date of Patent: Jan. 13, 2009

(54) CMOS OUTPUT DRIVER USING FLOATING WELLS TO PREVENT LEAKAGE CURRENT

(75) Inventor: Grant P. Kesselring, Milton, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/381,806

(22) Filed: May 5, 2006

(65) Prior Publication Data

US 2007/0257706 A1 Nov. 8, 2007

(51) Int. Cl.
*H03K 19/0175* (2006.01)
*H03K 19/094* (2006.01)

(52) U.S. Cl. .......................... 326/87; 326/82; 327/108; 327/379

(58) Field of Classification Search ........... 326/82, 326/83, 85, 87, 86, 33, 81; 327/534, 108, 327/109, 379, 381
See application file for complete search history.

(56) References Cited

U.S. PATENT DOCUMENTS

| 5,121,284 | A | | 6/1992 | Onodera et al. |
| 5,543,733 | A | * | 8/1996 | Mattos et al. ................. 326/81 |
| 5,570,043 | A | * | 10/1996 | Churchill ..................... 326/81 |
| 5,933,025 | A | * | 8/1999 | Nance et al. .................. 326/81 |
| 5,963,055 | A | * | 10/1999 | Tanaka et al. ................. 326/81 |
| 5,978,277 | A | | 11/1999 | Hsu et al. |
| 6,084,804 | A | | 7/2000 | McPartland |
| 6,351,158 | B1 | * | 2/2002 | Shearon et al. ............. 327/108 |
| 6,614,295 | B2 | | 9/2003 | Tsuchi |
| 6,859,074 | B2 | * | 2/2005 | Ajit ........................... 327/108 |
| 6,970,024 | B1 | * | 11/2005 | Reese et al. ................ 327/112 |

\* cited by examiner

*Primary Examiner*—James H. Cho
*Assistant Examiner*—Dylan White
(74) *Attorney, Agent, or Firm*—Cantor Colburn LLP; Michael LeStrange

(57) ABSTRACT

An I/O buffer circuit including: a driver circuit containing a pull-up device in a first floating well and a pull-down device in a second floating well; a first and second biasing circuits to bias the first and second floating wells in response to voltages internal and external to the I/O buffer circuit; and a first and second tracking circuits to bias each of said pull-up and pull-down devices in response to voltages internal and external to the I/O buffer circuit in a shutdown mode.

7 Claims, 3 Drawing Sheets

CMOS OUTPUT DRIVER USING FLOATING WELLS TO PREVENT LEAKAGE CURRENT

TRADEMARKS

IBM® is a registered trademark of International Business Machines Corporation, Armonk, N.Y., U.S.A. Other names used herein may be registered trademarks, trademarks or product names of International Business Machines Corporation or other companies.

BACKGROUND

1. Field of the Invention

The present disclosure relates generally to electrical and electronic circuits and more specifically to prevention of leakage current during PAD overshoot and undershoot.

2. Description of Background

CMOS bi-directional interface circuits generally require some tolerance to voltage over/undershoots at a driver/receiver interface terminal, referred to herein as a PAD, caused by mismatch impedance between the output of the driver/receiver and the transmission line. Interface circuit electrical specifications often require a certain amount of over/undershoot tolerance be designed into the I/O. For example, the electrical specification for a Universal Serial Bus interface circuit requires an I/O operating between 0-3.3V to be capable of withstanding continuous exposure to a −1V to 4.6V signal.

Two unique problems occur in the driver circuit of an I/O when the PAD voltage extends beyond the supply rail voltages (i.e. VDD and GND). First, the drain-substrate or drain-nwell diodes can forward bias causing unwanted leakage current from PAD to VDD or from GND to PAD. Second, the transistors making up the output stage of the driver can turn on slightly even when the driver is supposed to be disabled (e.g., the driver is in receive mode).

FIG. 1 illustrates the output stage of a typical bidirectional driver. The gate nodes of the output FETs are controlled by pre-drive circuits that tune the rise and fall times of the driver signal. The PAD pin is the output of the driver and also the input of the receiver circuit (not shown). The I/O circuitry runs off a 3.3V power supply in this example. In the event of an overshoot, the PAD pin can reach 4.6V. The drain of the pFET rises to a higher potential than the n-well that is connected to VDD330 (3.3V). As a result, the PFET drain to well junction becomes forward biased, and current is allowed to flow from PAD to VDD330 supply. Similarly, in the event of an undershoot, the PAD pin can reach −1.0V. The drain of the NFET falls to a lower potential than the substrate that is connected to ground (0.0V). As a result, the NFET drain to substrate junction becomes forward biased, and current is allowed to flow from GND to PAD.

Specific to the case when the bi-directional I/O is in receive mode, the driver circuit should be disabled. From FIG. 1, this happens when both pull-up and pull-down transistors in the driver are cut off (i.e., the pFET gate is at 3.3V and the nFET gate is at 0.0V). As long as the PAD voltage does not extend beyond the supply rails, these transistors remain off. However, the output pFET in the driver will turn on slightly if the PAD experiences an overvoltage e.g., PAD goes up to 4.6V). This is because the pFET drain voltage exceeds the gate voltage. The result is unwanted current flow from PAD to VDD330 supply through the pFET. Similarly, the output nFET in the driver will turn on slightly if the PAD experiences an undervoltage (e.g., PAD goes to −1V). This is because the nFET gate voltage exceeds the drain voltage. The result is unwanted current flow from GND supply to PAD through the nFET.

Accordingly, a leakage current prevention scheme is needed.

SUMMARY

The shortcomings of the prior art are overcome and additional advantages are provided through the provision of test generation methods.

Exemplary embodiments include an I/O buffer circuit including: a driver circuit containing a pull-up device in a first floating well and a pull-down device in a second floating well; a first and second biasing circuits to bias the first and second floating wells in response to voltages internal and external to the IC; and a first and second tracking circuits to bias each of said pull-up and pull-down devices in response to voltages internal and external to the IC in a shutdown mode.

Exemplary embodiments also include an I/O buffer circuit including: a driver circuit containing a pull-up device in a first floating well and a pull-down device in a second floating well; a first and second biasing circuits to bias the first and second floating wells in response to voltages internal and external to the IC; and a first and second tracking circuits to bias each of said pull-up and pull-down devices in response to voltages internal and external to the IC in a shutdown mode, wherein the driver circuit further comprises one or more transistors in series, the first and second biasing circuits comprise one or more transistors in series, the first and second tracking circuits comprise one or more transistors in parallel, the first floating well is a n-well and the second floating well is a p-well, and the circuit provides overvoltage and undervoltage protection.

System and computer program products corresponding to the above-summarized methods are also described and claimed herein.

Additional features and advantages are realized through the techniques of the present invention. Other embodiments and aspects of the invention are described in detail herein and are considered a part of the claimed invention. For a better understanding of the invention with advantages and features, refer to the description and to the drawings.

TECHNICAL EFFECTS

As a result of the summarized invention, technically we have achieved a solution that prevents current leakage during over/undershoot.

BRIEF DESCRIPTION OF THE DRAWINGS

The subject matter that is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

The detailed description explains the preferred embodiments of the invention, together with advantages and features, by way of example with reference to the drawings.

DETAILED DESCRIPTION

The disclosed circuit takes advantage of the ability to float an isolated p-well in a CMOS triple-well process technology. The output nFETs of the driver are placed in p-wells that are biased independent of the substrate voltage. A circuit that sets the well voltage to always be the lower potential of ground or PAD controls the floating p-well voltage. The p-well is set to the ground potential under normal operation, but in the event of an undershoot, the p-well floats to the PAD voltage. In this way, the problem of leakage currents from ground to PAD caused by a forward biased drain-substrate diode can be avoided.

This disclosed circuit also addresses the driver transistors turning on while the I/O is receiving a signal that presents voltage over/undershoots. The problem is corrected by implementing a feedback loop within the driver circuit that prevents the driver output transistors from turning on during receive mode, and does not adversely affect the performance of the driver in drive mode.

Figure 1:
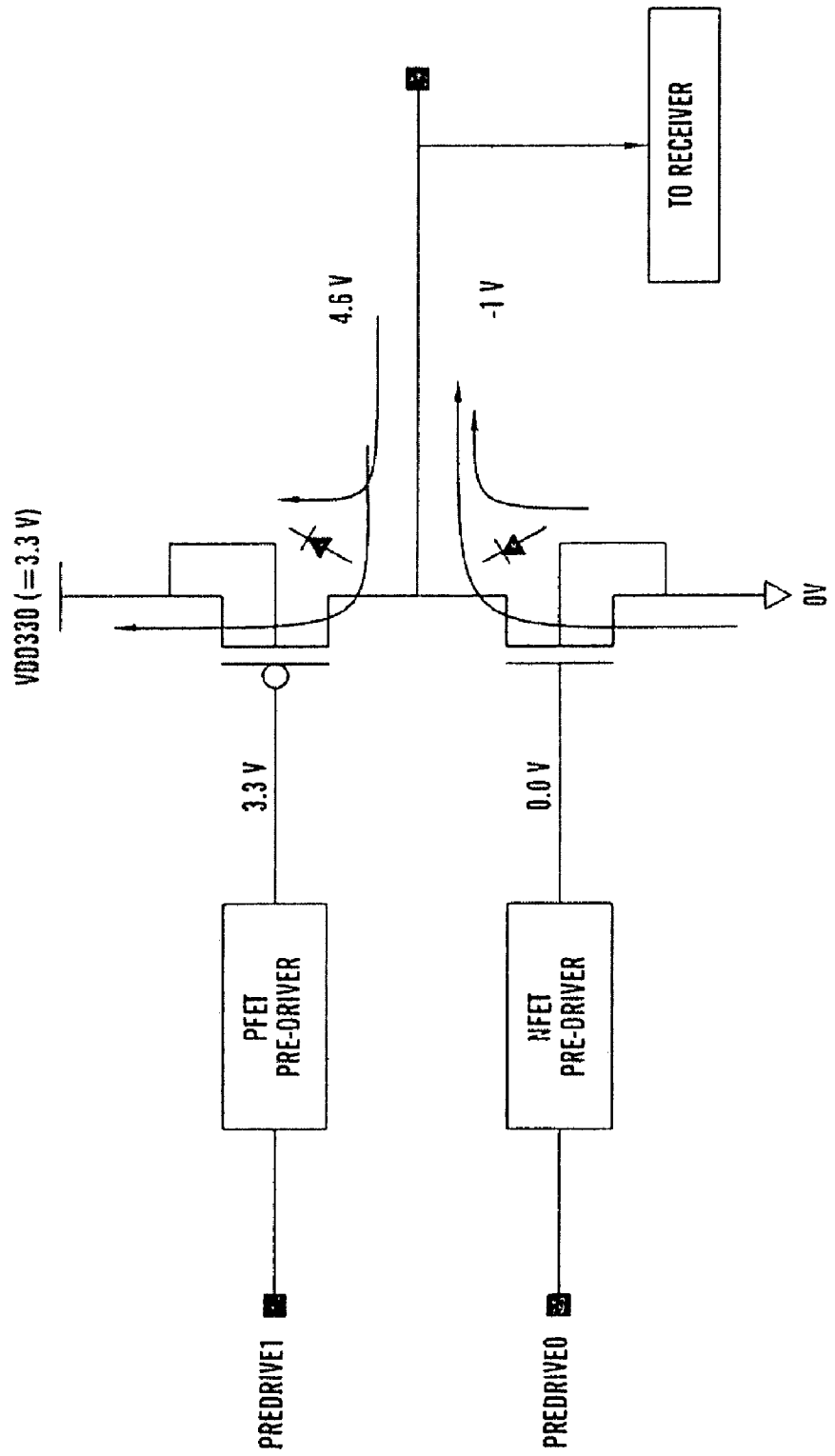
FIG. 1 illustrates the output stage of a typical bidirectional driver.
Figure 2:
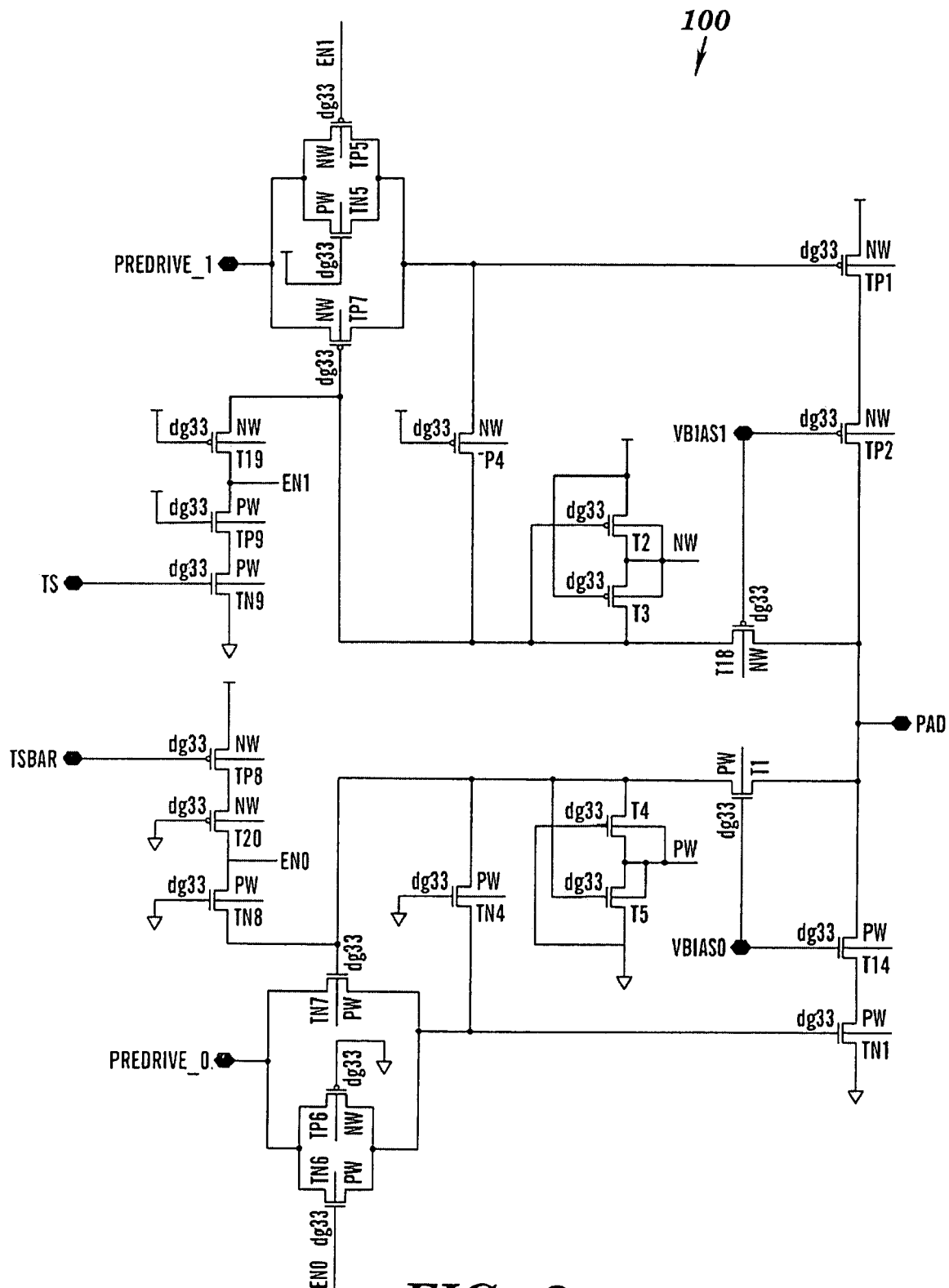
FIG. 2 illustrates an exemplary circuit that completely eliminates unwanted currents in the event of PAD over-voltage or under-voltage.

Referring now to FIG. 2, a circuit that completely eliminates unwanted currents in the event of PAD over-voltage or under-voltage is illustrated generally as 100. The transistors making up the output stage of the CMOS driver are TP1 and TN1. The protection circuit is broken into two parts: floating well and gate feedback.

The floating well circuit consists of two pFET transistors (T2 and T3) and two nFET transistors (T4 and T5). The pFET transistors T2 and T3 control the n-well voltage for the output stage of the I/O driver and the nFET transistors T4 and T5 control the p-well voltage for the output stage of the I/O driver. In one embodiment, the nFETs are placed within an isolated p-well that is biased independent from the rest of the substrate. Therefore, a triple well technology is used to implement this scheme.

During normal operation, the voltage at PAD is between VDD330 (3.3V) and GND (0V). In this mode, T2 is on while T3 is off. The n-well (node "NW") for the pFET TP1 is held at VDD330. Transistor T5 is on while T4 is off. The isolated p-well (node "PW") for the nFET output driver is held at GND. During an overshoot, PAD can reach 4.6V, causing T3 to turn on and T2 to turn off. As a result, the n-well voltage, NW, rises to whatever the PAD voltage is, thereby insuring that the output pFET drain-n-well junction can never forward bias. In other words, the pFET n-well voltage always floats to the higher of VDD330 or PAD. During an undershoot, PAD can reach −1V, causing T5 to turn off and T4 to turn on. As a result, the isolated p-well voltage, PW, falls to whatever the pad voltage is, thereby insuring that the output nFET drain to p-well junction can never forward bias. In other words, the nFET p-well voltage always floats to the lower of PAD or GND.

Figure 3:
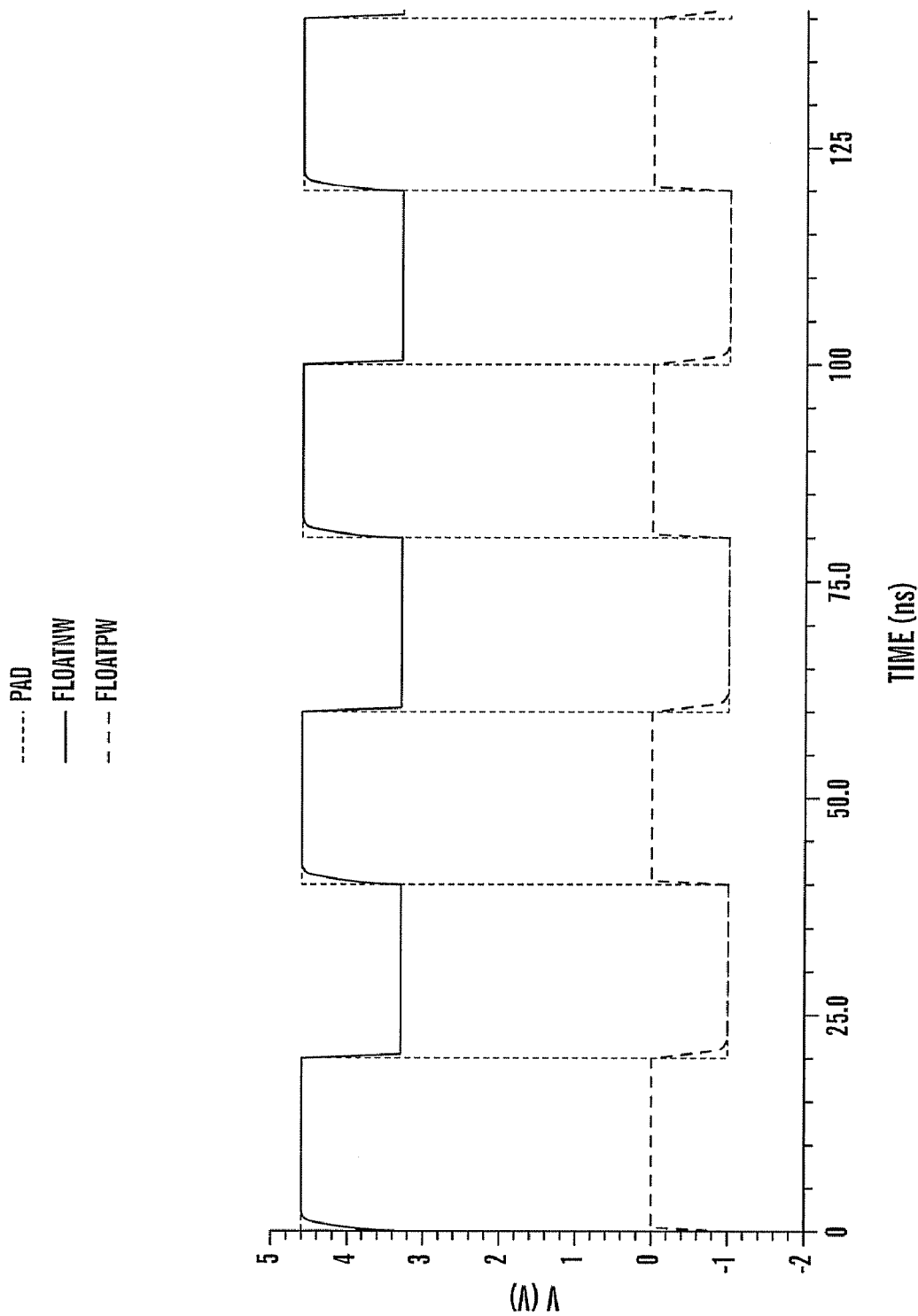
FIG. 3 illustrates sample waveforms corresponding to the operation of the circuit in FIG. 2.

Referring now to FIG. 3, waveforms for PAD, NW and PW are illustrated. The NW node is always held at VDD330 (3.3Volts) unless an overshoot exists at PAD; during an overshoot, the NW node rises to the PAD voltage. Likewise, the PW node is always held at GND (0 Volts) unless an undershoot exists at PAD; during undershoot, the PW node falls to the PAD voltage.

In one embodiment, only the pFETs and nFETs that are connected directly or indirectly to PAD need to be placed in the floating n-wells and p-wells. All other pFETs may be placed in n-wells connected to VDD330 and all other nFETs may be placed in the substrate connected to GND.

Returning now to FIG. 2, the circuit also addresses the driver transistors turning on when the I/O is receiving an overshoot or undershoot signal. The problem is corrected by implementing a feedback loop between PAD and the gates of the output driver transistors. Transistor TP4 connects PAD to the gate of TP1. If the voltage of PAD exceeds the VDD330 voltage, then TP4 will turn on and raise the gate voltage of TP1 to track with PAD. In this way, the pFET TP1 is never allowed to turn on in receive mode due to an over-voltage at PAD. Similarly, transistor TN4 connects PAD to the gate of TN1. If the voltage of PAD extends below GND, then TN4 will turn on and lower the gate voltage of TN1 to track with PAD. In this way, the nFET TN1 is never allowed to turn on in receive mode due to an under-voltage at PAD.

The function of the pass gate (made up of TP5 and TN5) depends on the I/O mode. While in drive mode, the pass gate passes an undistorted signal from the pre-drive to the output pFET TP1. During receive mode, the pass gate TP5, TN5 prevents current from flowing back to the pre-drive stage in the event of a PAD voltage overshoot. Similarly, the pass gate (made up of TP6 and TN6) passes an undistorted signal from the pre-drive to the output nFET TN1. In receive mode, the pass gate TP6, TN6 prevents current from flowing from the pre-drive stage in the event of a PAD voltage undershoot.

Transistors TP8, TN8, TP9 and TN9 change the mode of the pass gates. While in drive mode (TS=3.3V and TSBAR=0.0V), the nodes EN0 and EN1 are 3.3V and 0.0V, respectively. While in receive mode (TS=0.0V and TSBAR=3.3V), the nodes EN0 and EN1 remain at these values unless the PAD has a voltage over/undershoot. If the PAD voltage is higher than VDD330, then node EN1 assumes the value of PAD and keeps TP5 from turning on, which prevents current flow back into the pre-drive stage. If the PAD voltage is lower than GND, then node EN0 assumes the value of PAD and keeps TN6 from turning on, which prevents current from the pre-drive forward.

In one embodiment, transistors TP8 and TN9 may be sized much larger than TN8 and TP9 to avoid degradation in signal integrity through the pass gates while in driving mode. In an alternative embodiment, device TP7 and TN7 can be used to ensure signal integrity during normal driving mode.

The circuit 100 illustrated in FIG. 2 prevents junction leakage from drain to substrate of PMOS transistor TP1 when the PAD voltage is higher than VDD330, and prevents junction leakage from drain to substrate of NMOS transistor TN1 when the PAD voltage is lower than GND. In addition, the circuit 100 turns PMOS transistor TP1 off completely even when the PAD voltage is higher than VDD330, turns NMOS transistor TN1 off completely even when the PAD voltage is lower than GND, and ensures that no transistor has a gate oxide voltage that exceeds the maximum allowable oxide voltage for the technology.

In one embodiment, the voltages applied to nodes VBIAS1 and VBIAS0 are generated according to the following equations:

$$VBIAS1 = Vpad(max) - Vox(max)$$

$$VBIAS0 = Vox(max) + Vpad(min)$$

where Vpad(max) is the maximum overshoot voltage at PAD, Vpad(min) is the minimum undershoot voltage at PAD, and Vox(max) is the maximum gate oxide allowed by the technology. For example, the PAD voltage will reach 4.6V during an overshoot and the maximum gate oxide voltage allowed is 3.6V. Thus, VBIAS1 would need to be 4.6–3.6 or 1.0V. Similarly, the pad voltage will reach −1V during an undershoot. Thus, VBIAS0 would need to be 3.6+(−1) or 2.6V.

The circuit 100 includes a driver output stage, n-well biasing circuit, p-well biasing circuit, PMOS gate tracking circuit, and NMOS gate tracking circuit. Operationally, the circuit can be broken down into four modes: driving a logic high, driving a logic low, receiving a logic high (possibly with overshoot), and receiving a logic low (possibly with undershoot).

When the circuit 100 is in drive high mode, the inputs PREDRIVE_1 and PREDRIVE_0 are both 0V. The driver enable inputs TS and TSBAR are 3.3V and 0V respectively. Output transistors TP1 and TP2 are on while transistors TN1 is off. This causes the output, PAD, to rise to VDD (3.3V). The pre-drive signal, PREDRIVE_1, propagates through transistor TN5 because the gate of the transistor TN5 is connected to VDD (3.3V). The gate of TP2 is controlled by VBIAS1 (1.0V) and the gate of T14 is controlled by VBIAS0 (2.6V) according to the equations given in the previous section. With the pad at 3.3V and the gate of passgate T18 at 1.0V, the passgate T18 is on. The 3.3V at the pad propagates through T18 to the drain of TP4, keeping it off. The n-well bias circuit made up of T2 and T3 sets the floating NW node to 3.3V. There is no leakage current through the parasitic p-n junction diode at the drain of TP1 because the drain and substrate are both 3.3V. The input PREDRIVE_0 is set to 0V and propagates through the passgate TN6 to the gate of TN1. The signal is allowed to propagate through TN6 because EN0 is 3.3V. The node EN0 is set to 3.3V because TP8 and T20 are on. With pad at 3.3V and the gate of passgate T1 set to VBIAS0 (2.6V), the node connected to the gate of TN7 is approximately VBIAS0−Vthn (Vthn is threshold voltage of T1). The transistor TN4 remains off. The p-well bias circuit made up of T4 and T5 set the floating PW node to 0V. There is no leakage through the device TN1 because the gate and source of the device are both at 0V. There is no leakage current through the parasitic n-p junction diode at the drain of TN1 because the drain and substrate are both 0V.

When the circuit is in drive low mode, the inputs PREDRIVE_1 and PREDRIVE_0 are both 3.3V. The driver enable inputs TS and TSBAR are still 3.3V and 0V respectively. Output transistor TP1 is off while transistors T14 and TN1 are on. This causes the output, PAD, to fall to GND (0V). The pre-drive signal, PREDRIVE_1, propagates through transistor TP5 because the gate of transistor TP5 is connected to EN1. The node EN1 is set to 0V because the input signal TS is 3.3V causing transistor TN9 to pull EN1 to ground. The gate of TP2 is controlled by VBIAS (1.0V) and the gate of T14 is controlled by VBIAS0 (2.6V) according to the equations given in the previous section. With pad at 0V and the gate of passgate T18 set to VBIAS1 (1V), the node connected to the gate of TP7 is approximately VBIAS1+Vthp (Vthp is threshold voltage of T18). The transistor TP4 remains off. The n-well bias circuit made up of T2 and T3 sets the floating NW node to 3.3V. There is no leakage through the device TP1 because the source and gate of the device are both at 3.3V. The input PREDRIVE_0 is set to 3.3V and propagates through the passgate TP6 to the gate of TN1. The signal is allowed to propagate through TP6 because the gate of TP6 is connected to GND (0V). With pad at 0V and the gate of passgate T1 set to VBIAS0 (2.6V), the node connected to the gate of TN7 is 0V. The transistor TN4 remains off. The p-well bias circuit made up of T4 and T5 sets the floating PW node to 0V. There is no leakage through the device TP1 because the gate and source of the device are both at 3.3V. There is no leakage current through the parasitic n-p junction diode at the drain of TN1 because the drain and substrate are both 0V.

When the circuit is in receive mode the pad may experience an overshoot voltage reaching 4.6V. The input PREDRIVE_1 is set to 3.3V and the input PREDRIVE_0 is set to 0V. During normal receive mode operation (no overshoot), transistor TP1 would be turned off by applying 3.3V to the gate and TN1 would be turned off by applying 0V to the gate. However, since the pad voltage is 4.6V the transistor TP1 would not remain turned off. To avoid this problem, the pad voltage is passed through transistor T18 to the drain of TP4. The gate of TP4 is connected to VDD (3.3v), which turns on the transistor TP4 and forces the gate of TP1 to 4.6V also. Therefore, transistor TP1 remains off even though the pad voltage has exceeded the VDD supply level. At the same time, the 4.6V level passed through transistor T18 allows the n-well bias circuit, made up of T2 and T3, to set the floating NW node to 4.6V. There is no leakage current through the parasitic p-n junction diode at the drain of TP1 because the drain and substrate are both 4.6V. Also at the same time, the gate voltage of TP7 is 4.6V, which turns off the device. The transistor TP5, whose gate is connected to EN1, is also turned off. Node EN1 is 4.6V because transistors T19 is on while TN9 is off. Since all three transistors TP7, TN5, TP5 are off, there is no connection between the gate of TP1 (now 4.6V) and the PREDRIVE_1 input (at 3.3V).

The node EN1 can reach 4.6V during overshoot, so it is important that an additional NMOS (TP9) be inserted between T19 and TN9. This prevents an excessively large gate oxide voltage from developing across the gate of TN9. With the pad voltage at 4.6V, the transistor T1 passes a voltage equal to VBIAS0−Vtln (where Vthn is the threshold voltage of T1). This voltage level keeps TN4 off and the p-well bias circuit sets PW to 0V. The signal from PREDRIVE_0 (0V) is passed through TN6 and TN7 to the gate of TN1. Therefore, the transistor TN1 remains completely off. During an overshoot voltage event at the pad, the transistors TP2, T14 and T18, T1 protect the other transistors (TP1, TN1, TP4, TN4, T3, T4, TN7, TP7) from otherwise developing excessively large voltages across their gate oxides or from drain to source.

When the circuit is in receive mode the pad may experience an undershoot voltage reaching −1V. The input PREDRIVE_1 is set to 3.3V and the input PREDRIVE_0 is set to 0V. During normal receive mode operation (no undershoot), transistor TP1 would be turned off by applying 3.3V to the gate and TN1 would be turned off by applying 0V to the gate. However, since the pad voltage is −1V the transistor TN1 would not remain turned off. To avoid this problem, the pad voltage is passed through transistor T1 to the drain of TN4. The gate of TN4 is connected to GND (0V), which turns on the transistor and forces the gate of TN1 to −1V also. Therefore, transistor TN1 remains off even though the pad voltage is below the GND supply level. At the same time, the −1V level passed through transistor T1 allows the p-well bias circuit, made up of T4 and T5, to set the floating PW node to −1V. There is no leakage current through the parasitic n-p junction diode at the drain of TN1 because the drain and substrate are both −1V. Also at the same time, the gate voltage of TN7 is −1V, which turns off the device. The transistor TN6, whose gate is connected to EN0, is also turned off. Node EN0 is −1V because transistors TN8 is on while TP8 is off. Since all three transistors TN7, TP6, TN6 are off, there is no connection between the gate of TN1 (now −1V) and the PREDRIVE_0 input (at 0V).

The node EN0 can reach −1V during undershoot, so it is important that an additional PMOS (T20) be inserted between TP8 and TN8. This prevents an excessively large gate oxide voltage from developing across the gate of TP8. With the pad voltage at −1V, the transistor T18 passes a voltage equal to VBIAS1+Vthp (where Vthp is the threshold voltage of T18). This voltage level keeps TP4 off and the n-well bias circuit sets NW to 3.3V. The signal from PREDRIVE_1 (3.3V) is passed through TP5 and TP7 to the gate of TP1. Therefore, the transistor TP1 remains completely off. During an undershoot voltage event at the pad, the transistors TP2, T14 and T18, T1 protect the other transistors (TP1, TN1, TP4, TN4, T3, T4, TN7, TP7) from otherwise developing excessively large voltages across their gate oxides or from drain to source.

The capabilities of the present invention can be implemented in software, firmware, hardware or some combination thereof.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. An I/O buffer circuit comprising: a driver circuit containing a first pull-up device in a first floating well, a first pull-down device in a second floating well, a second pull-up device in an output stage and a second pull-down device in the output stage; first and second biasing circuits to bias the first and second floating wells in response to voltages internal and external to the I/O buffer circuit; a first feedback loop operative to raise a gate voltage of the second pull-up device when a PAD voltage exceeds 3.3 volts; a second feedback loop operative to lower a gate voltage of the second pull-down device when the PAD voltage is less than ground; and a first and second tracking circuits to bias each of the second pull-up and the second pull-down devices in response to voltages internal and external to the I/O buffer circuit in a shutdown mode, wherein the first and second tracking circuits are operative to prevent greater than 3.3 volts across nodes in the first and second floating wells.

2. The circuit of claim 1, wherein the driver circuit further comprises one or more transistors in series.

3. The circuit of claim 2, wherein the first and second biasing circuits comprise one or more transistors in series.

4. The circuit of claim 3, wherein the first and second tracking circuits comprise one or more transistors in parallel.

5. The circuit of claim 4, wherein the first floating well is a n-well and the second floating well is a p-well.

6. The circuit of claim 5, wherein the I/O buffer circuit provides overvoltage and undervoltage protection.

7. The circuit of claim 6, wherein two pFET transistors control a voltage of the n-well and two nFET transistors control a voltage of the p-well.

* * * * *